(12) United States Patent
Balakrishnan et al.

(10) Patent No.: US 9,659,829 B1
(45) Date of Patent: *May 23, 2017

(54) HYBRID ORIENTATION VERTICALLY STACKED III-V AND GE GATE-ALL-AROUND CMOS

(71) Applicant: INTERNATIONAL BUSINESS MACHINES CORPORATION, Armonk, NY (US)

(72) Inventors: Karthik Balakrishnan, Yorktown Heights, NY (US); Pouya Hashemi, Yorktown Heights, NY (US); Sanghoon Lee, Yorktown Heights, NY (US); Alexander Reznicek, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/242,659

(22) Filed: Aug. 22, 2016

Related U.S. Application Data

(63) Continuation of application No. 15/057,299, filed on Mar. 1, 2016, now Pat. No. 9,472,471.

(51) Int. Cl.
*H01L 21/84* (2006.01)
*H01L 29/06* (2006.01)
*H01L 21/8238* (2006.01)

(52) U.S. Cl.
CPC ........ *H01L 21/845* (2013.01); *H01L 21/8238* (2013.01); *H01L 21/823828* (2013.01); *H01L 21/823864* (2013.01); *H01L 29/0673* (2013.01)

(58) Field of Classification Search
CPC . H01L 29/772; H01L 29/66674; H01L 21/38; H01L 21/385; H01L 21/388; H01L 21/66712; H01L 21/3065; H01L 21/31115; H01L 21/31116; H01L 21/31138; H01L 21/28518
USPC ....... 438/135, 137, 173, 188, 691, 700, 706, 438/717, 722, 735, 736
See application file for complete search history.

(56) References Cited

U.S. PATENT DOCUMENTS

| | | | |
|---|---|---|---|
| 8,900,951 B1 | 12/2014 | Cheng et al. | |
| 8,981,449 B2 * | 3/2015 | Bedell | H01L 29/788 257/314 |
| 2005/0285175 A1 * | 12/2005 | Cheng | H01L 27/10864 257/302 |
| 2014/0103414 A1 * | 4/2014 | Koldiaev | H01L 21/845 257/296 |
| 2015/0287642 A1 * | 10/2015 | Chang | H01L 21/8249 438/236 |

FOREIGN PATENT DOCUMENTS

WO 2013095341 A1 6/2013

OTHER PUBLICATIONS

Karthik Balakrishnan, Pouya Hashemi, Sanghoon Lee, Alexander Reznicek, "Fabrication Method for Hybrid Orientation Vertically Stacked III-V and Ge Gate-All-Around CMOS", Dec. 2, 2015, IP.com No. 000244332.

* cited by examiner

*Primary Examiner* — Shogo Sasaki
(74) *Attorney, Agent, or Firm* — Shimokaji IP

(57) ABSTRACT

A method of CMOS construction may include stacked III-V nanowires and stacked Ge nanowires. The CMOS construction may include a hybrid orientation with surface SOI and a standard substrate.

1 Claim, 2 Drawing Sheets

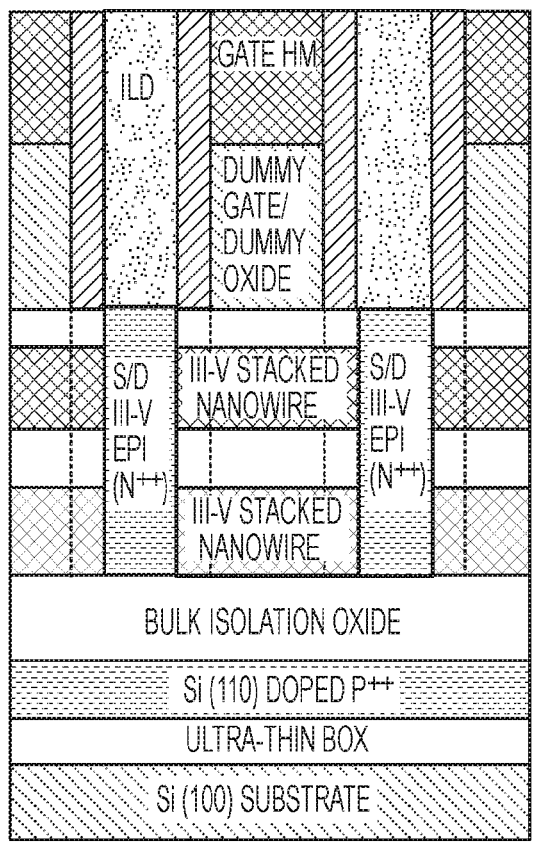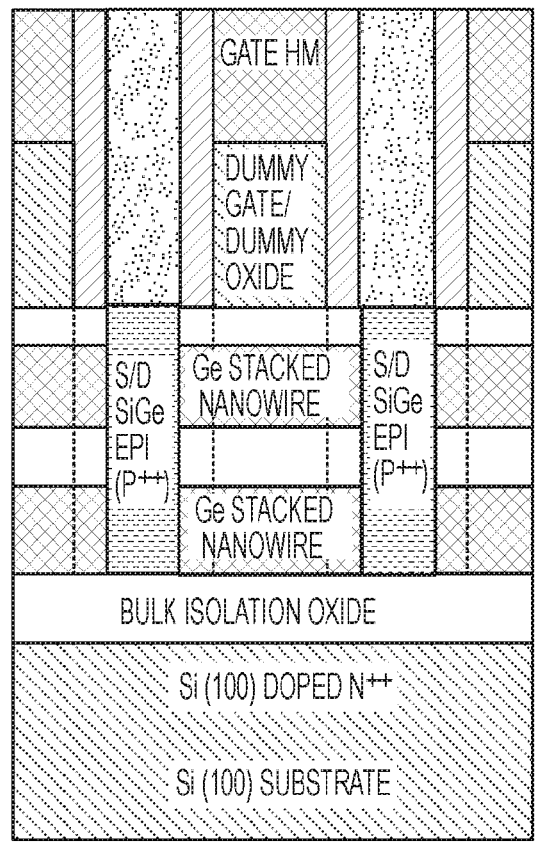
NFET CROSS-SECTION ALONG THE GATE, AFTER S/D EPI AND ILD FILL
FIG. 2
PFET CROSS-SECTION ALONG THE GATE, AFTER S/D EPI AND ILD FILL
FIG. 3

HYBRID ORIENTATION VERTICALLY STACKED III-V AND GE GATE-ALL-AROUND CMOS

CROSS-REFERENCE TO RELATED APPLICATIONS

This application is a continuation in part of application Ser. No. 15/057,299 filed Mar. 1, 2016, which is now U.S. Pat. No. 9,472,471.

BACKGROUND OF THE INVENTION

The present invention generally relates to a method of creating CMOS. More particularly, the present invention relates to a hybrid stacked nanowire featuring III-V nanowires and Ge.

High mobility III-V and Germanium (Ge) are attractive for 5 nm CMOS in a gate all around structures. For integration of III-V on Silicon (Si) substrate, growth on Si surfaces have shown promise. Growth of Ge can be slow and difficult.

As can be seen, there is a need for a hybrid orientation stacked nanowire featuring III-V nanowires and Ge.

SUMMARY OF THE INVENTION

In one aspect, a method may include providing a hybrid oriented SOI (Silicon-On-Insulator) substrate (HOT substrate); P++ doping the SOI; masking a first region of the SOI; etching the SOI, and epitaxially growing the SOI from substrate seed; removing STI (Shallow Trench Isolation) area on the SOI; forming a hardmask on the SOI; forming a fin pattern on the SOI; utilizing CMP (Chemical-mechanical planarization) to process first dielectric removal; revealing recess and fin after material removal; filling and removing a second dielectric utilizing CMP; revealing recess and fin after second dielectric removal; filling and recessing the first and second dielectrics to form a stack of dielectrics; depositing a spacer as a liner over the CMOS structure; forming a sidewall from the spacer; forming and RIE (Reactive Ion Etching) a dielectric stack; blocking a PFET area; stripping a dielectric, Epitaxial III-V growth on sidewalls of the CMOS structure; using RIE to remove unwanted III-V material; blocking a NFET area, strip second dielectric, and epitaxially grow the Ge on a sidewalls of the CMOS structure; removing unwanted Ge using RIE; etching the hardmask (HM) using RIE on the fins; stripping the spacer hardmask; fabricating a FET, create gates and hardmask using CMP; forming spacers, mask nFETs and S/D (Source/drain) pFET epi (epitaxy), mask pFET, and S/D nFET epi (epitaxy), deposit ILD (inter-level dielectric) followed by CMP; stripping the gate and oxide, remove first dielectric to suspend nanowires; and utilizing high-k (HK)/work function (WF) Metal Gate (MG) formation, and MG fill.

These and other features, aspects and advantages of the present invention will become better understood with reference to the following drawings, description and claims.

BRIEF DESCRIPTION OF THE DRAWINGS

FIG. 2 illustrates a cross-sectional view of an NFET along a gate after S/D (source to drain) epitaxy and ILD fill; and FIG. 3 illustrates a cross-sectional view of a PFET along a gate after S/D epitaxy and ILD (inter-level-dielectric) fill.

DETAILED DESCRIPTION OF THE INVENTION

Figure 1:
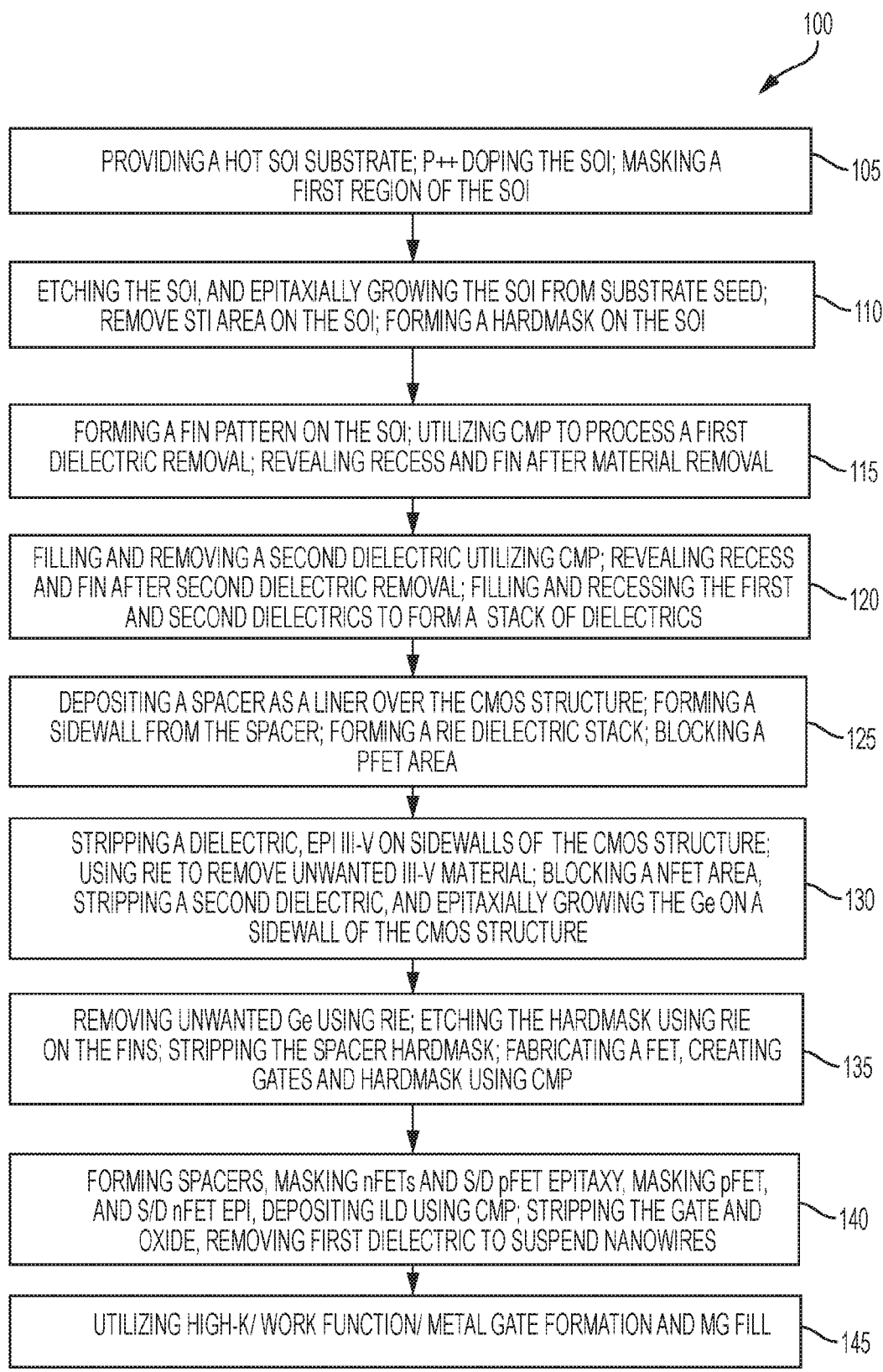
In FIG. 1 illustrates a flow chart for hybrid orientation of vertically stacked II-V and Ge according to an exemplary embodiment of the present invention.

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide a method for hybrid stacked nanowire featuring III-V nanowires and Ge nanowires.

In FIG. 1 a method of forming a CMOS structure, may include a step 105 of providing a hot SOI (Silicon-On-Insulator) substrate (HOT substrate); P++ doping the SOI; masking a first region of the SOI. A step 110 may include etching the SOI, and epitaxially growing the SOI from substrate seed; removing STI (Shallow Trench Isolation) area on the SOI; forming a hardmask on the SOI. A step 115 may include forming a fin pattern on the SOI; utilizing CMP (Chemical-mechanical planarization) to process first dielectric removal; revealing recess and fin after material removal. A step 120 may include filling and removing a second dielectric utilizing CMP; revealing recess and fin after second dielectric removal; filling and recessing the first and second dielectrics to form a stack of dielectrics. A step 125 may include depositing a spacer as a liner over the CMOS structure; forming a sidewall from the spacer; forming and RIE (Reactive Ion Etching) a dielectric stack; blocking a PFET area. A step 130 may include stripping a dielectric, Epitaxial III-V growth on sidewalls of the CMOS structure; using RIE to remove unwanted III-V material; blocking a NFET area, stripping second dielectric, and epitaxially growing the Ge on a sidewall of the CMOS structure; A step 135 may include removing unwanted Ge using RIE; etching the hardmask (HM) using RIE on the fins/mandrel; stripping the spacer hardmask; fabricating a FET, creating gates and hardmask using CMP. A step 140 may include forming spacers, masking nFETs and S/D (Source/drain) pFET epi (epitaxy), mask pFET, and S/D nFET epi (epitaxy), deposit ILD (inter-level dielectric) followed by CMP; stripping the gate and oxide, removing first dielectric to suspend nanowires. A step 145 may include utilizing high-k (HK)/ work function (WF) Metal Gate (MG) formation, and MG fill.

FIG. 2 illustrates a cross-sectional view of an NFET along a gate after S/D (source to drain) epitaxy and ILD fill. FIG. 3 illustrates a cross-sectional view of a PFET along a gate after S/D epitaxy and ILD (inter-level-dielectric) fill.

In an embodiment, the method 100 may use a surface SOI and a standard silicon substrate to form a hybrid substrate. The STI (Shallow Trench Isolation) technique, or box isolation technique, may be utilized, for example, between steps 105 and 110. In an embodiment, the fin pattern for step 115 may be created for areas doped N as well as areas doped P.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer program product for forming a CMOS structure, the computer program product comprising a non-transitory computer readable storage medium having program instructions embodied therewith, the program instructions executable by a computer to cause the computer to:
provide a hot SOI substrate;
P++ dope the SOI;
mask a first region of the SOI;
etch the SOI, and epitaxy the SOI from substrate seed;
remove STI area on the SOI;
form a hardmask on the SOI;
form a fin pattern on the SOI;
utilize CMP to process first dielectric removal;
reveal recess and fin after material removal;
fill and remove a second dielectric utilizing CMP;
reveal recess and fin after second dielectric removal;
fill and recess the first and second dielectrics to form a stack of dielectrics;
deposit a spacer as a liner over the CMOS structure;
form a sidewall from the spacer;
form and RIE a dielectric stack;
block a PFET area;
strip a dielectric, Epitaxially grow III-V material on sidewalls of the CMOS structure;
use RIE to remove unwanted III-V material;
block a NFET area, strip second dielectric, and epitaxially grow the Ge on a sidewall of the CMOS structure;
remove unwanted Ge using RIE;
etch the hardmask using RIE on the fins;
strip the spacer hardmask;
fabricate a FET, create gates and hardmask using CMP;
form spacers, mask nFETs and S/D pFET epitaxy, mask pFET, and S/D nFET epitaxy, deposit inter-level dielectric followed by CMP;
strip the gate and oxide, remove first dielectric to suspend nanowires; and
utilize high-K work function metal gate formation, and metal gate fill.

* * * * *